United States Patent
Edmunds et al.

(12) 
(10) Patent No.: US 6,501,650 B2
(45) Date of Patent: Dec. 31, 2002

(54) SERIES-PARALLEL FANS SYSTEM

(75) Inventors: Howard Ross Edmunds, Roanoke, VA (US); John Earl Bittner, Troutville, VA (US); Brent Christopher Teal, Carlsbad, CA (US); Thanh Ngoc Nguyen, Poway, CA (US); Brian Matthew Aiken, Roanoke, VA (US); Christopher James McMenamin, Roanoke, VA (US); Andrew Gordon Phillip, Roanoke, VA (US); Christopher Todd Moore, Roanoke, VA (US); Kyle Craig Stott, Brooklyn, OH (US); Rick Lynn Gintz, Roanoke, VA (US); Fred Henry Boettner, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/681,415

(22) Filed: Mar. 30, 2001

(65) Prior Publication Data

US 2002/0141156 A1 Oct. 3, 2002

(51) Int. Cl.$^7$ ................................................. H05K 7/20
(52) U.S. Cl. ..................... 361/695; 62/259.2; 165/80.3; 454/184; 363/144
(58) Field of Search .......................... 62/259.2; 165/80.2, 165/80.3; 312/223.2; 361/688, 690, 694–696, 724–726, 839; 363/141, 144; 454/184

(56) References Cited

U.S. PATENT DOCUMENTS

| | | | | |
|---|---|---|---|---|
| 3,280,377 A | * | 10/1966 | Harris et al. ................ | 361/690 |
| 3,646,400 A | * | 2/1972 | Demarest et al. ........... | 361/695 |
| 3,780,798 A | * | 12/1973 | Reimer ........................ | 361/690 |
| 3,955,122 A | * | 5/1976 | Maynard et al. ............ | 361/690 |
| 4,106,052 A | | 8/1978 | Schierz | |
| 4,128,870 A | | 12/1978 | Knobloch et al. | |
| 5,283,716 A | * | 2/1994 | Banitt et al. ................ | 361/690 |
| 5,831,847 A | | 11/1998 | Love | |

* cited by examiner

Primary Examiner—Gregory Thompson
(74) Attorney, Agent, or Firm—Hunton & Williams

(57) ABSTRACT

An apparatus and method for mounting electrical devices in a housing at an angle relative to the ground is provided. The apparatus comprises a housing having a top, bottom, and sides, each of which may be open, closed or ventilated. One or more electrical devices are located in the housing and are oriented at an angle relative to the horizontal ground. The electrical devices may be silicon controlled rectifiers that serve as a power bridge between an exciter and a power generator. A method for mounting electrical devices in a housing at an angle relative to the horizontal ground is also provided.

44 Claims, 3 Drawing Sheets

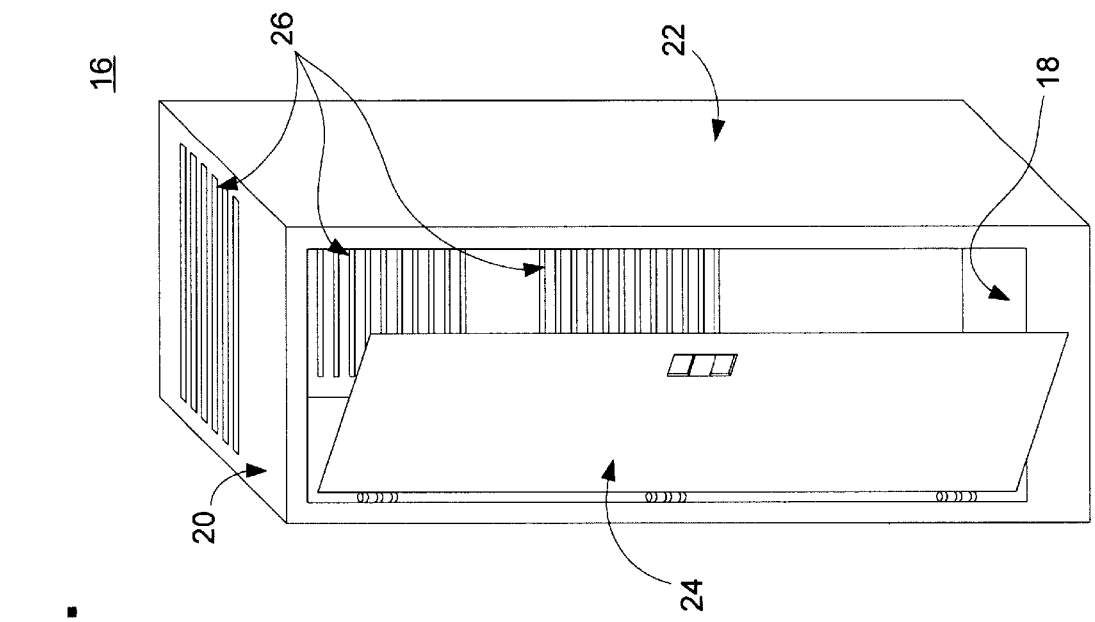
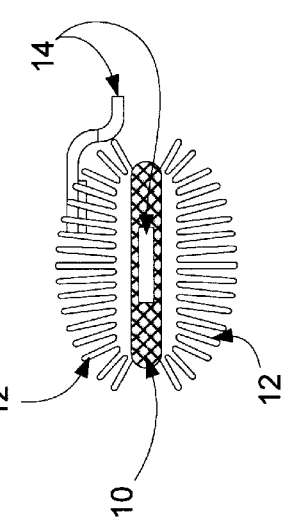
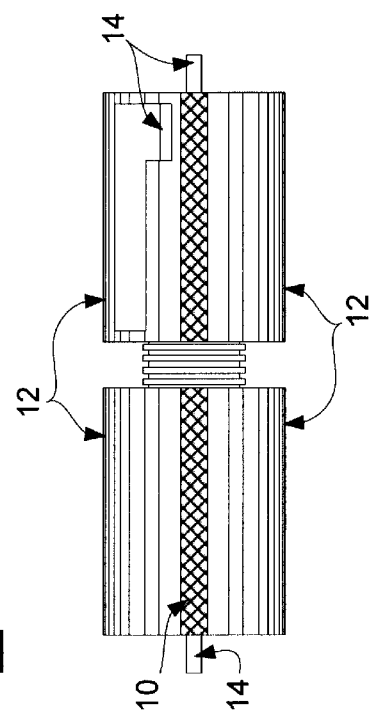

SERIES-PARALLEL FANS SYSTEM

BACKGROUND OF THE INVENTION

The present invention relates generally to cooling systems for electrical equipment. More particularly, the present invention relates to a unique angled mounting system for heat-generating electrical devices.

Electrical devices have found broad application in industrial systems. Such devices may be used in any system that provides or handles high levels of electricity, and may comprise anything from a simple resistor or fuse to a complex computer-controlled solid state device. Some electrical devices, such as Silicon Controlled Rectifiers (SCRs) produce a substantial amount of heat when they are in operation. In many cases, the heat level is minimal, but in some cases the heat produced causes degradation in the performance of the electrical devices that leads to measurable, and often valuable, losses.

The need often arises in power generation facilities to convert an alternating current (AC) of electricity into a direct current (DC) of electricity. For example, generator systems that provide AC electricity for industrial or consumer use typically require a source of DC electricity to excite the electromagnetic field of the main generator unit. This DC electricity is often provided by another AC generator, called an exciter, which may be mounted on the same shaft as the main generator unit. The AC output of the exciter must be converted into DC electricity before being introduced to the main generator unit. A device called a power bridge is often used to accomplish this AC to DC conversion, and power bridges are often comprised of a bank of SCRs.

SCRs are solid-state devices that provide flexible, reliable, and very fast control over voltages and currents. SCRs are silicon-based thyristor units, often having no moving parts, and which are typically shaped like a section of a cylinder or puck. Several SCRs (often six) may be arranged into a power bridge to provide AC-to-DC power conversion. The SCRs in a power bridge may be operated by sophisticated electronic systems that can be tailored to accommodate a great variety of electrical system hardware or power output requirements. Modern power generation systems rely very heavily on SCR-based power bridges to provide a reliable and consistent supply of electricity to consumers.

SCR power bridges are desirably arranged in a modular rack system. Rack-mounted SCRs are easily removed, repaired, replaced, or otherwise serviced, and the cost of constructing power systems is reduced by using modular rack assemblies. Furthermore, a rack-mounted system can be easily retrofitted with newer components, or such a system can be easily added to an existing power generation unit. Rack systems are also typically more compact than other SCR power bridges. Rack systems also provide a safety benefit in that the rack may be encased in a housing that prevents accidental contact with the electrical devices, and may be provided with lockout equipment that helps ensure that the power is off when the cabinet is opened.

As noted before, SCRs, like many other electrical components used in industrial applications, produce heat during their operation. The heat produced by SCRs may cause the SCRs or the surrounding equipment to fail or to operate at a reduced performance level. In order to prevent such overheating, the SCRs must be cooled. Prior art has proposed various methods for cooling SCRs. In a typical arrangement, the SCRs are encased in heat sinks comprising heat-conducting vanes. The heat sinks operate solely by free conduction of heat to the ambient air, or air may be forced over the vanes to provide additional convection cooling of the SCRs.

The overheating problem may be exacerbated when SCRs are placed in a modular rack mounting system. Many previously known rack systems mount the SCRs in a horizontal position. In another typical arrangement, the SCRs are mounted vertically on a flat surface or framework. In order to conserve space, the SCRs are usually mounted in columns having several SCRs mounted directly above or below one another.

Known SCR mounting systems, such as those discussed above, are problematic in that they fail to provide even cooling to all of the SCRs. Cooling air tends to rise through the rack, contacting several SCRs as it passes through the system. The air heats up as it rises, providing the upper SCRs less cooling benefit, and thereby reducing the performance of the upper SCRs.

Therefore, it would be desirable to provide an apparatus for holding electrical devices that provides consistent and even cooling of all of the electrical devices. It would also be desirable for such an apparatus to accommodate various sizes of electrical devices in a compact space. Furthermore, it would be desirable to provide an apparatus to hold electrical devices such that the electrical devices may be easily removed, repaired, replaced, or otherwise serviced.

SUMMARY OF INVENTION

The present invention overcomes the problems discussed above, and provides additional advantages, by employing an apparatus for mounting heat-generating electrical devices. The apparatus has a housing with a horizontal bottom, a horizontal top, and vertical sides extending vertically between the bottom and the top. Inside the housing are one or more heat-generating electrical devices, which are releasably mounted within the housing. The electrical devices are oriented at an angle relative to the bottom of the housing. In various embodiments of the invention, the mounting angle of the electrical devices may be selected to promote cooling, improve serviceability, provide a space-saving benefit, or to provide other benefits.

In one embodiment the electrical devices are three pairs of silicon controlled rectifiers. Each pair of silicon controlled rectifiers is mounted on an insulated mounting platform ("platform"). Each is mounted in the housing at an angle, and the three platforms are arranged in a vertical stack. The housing also has ventilation openings in at least one of the bottom, top, and sides.

The present invention also consists of a method for mounting electrical devices in a housing such that the electrical devices are oriented at an angle relative to the bottom of the housing.

BRIEF DESCRIPTION OF THE DRAWINGS

The present invention can be understood more completely from the following Detailed Description of exemplary embodiments and the accompanying drawings, in which:

FIG. 1 is an end view of an exemplary electrical device with attached heat sinks;

FIG. 2 is a side view of an exemplary electrical device with attached heat sinks;

FIG. 3 is an isometric view of an embodiment of a housing with the electrical devices removed;

DETAILED DESCRIPTION OF THE INVENTION

Figure 5:
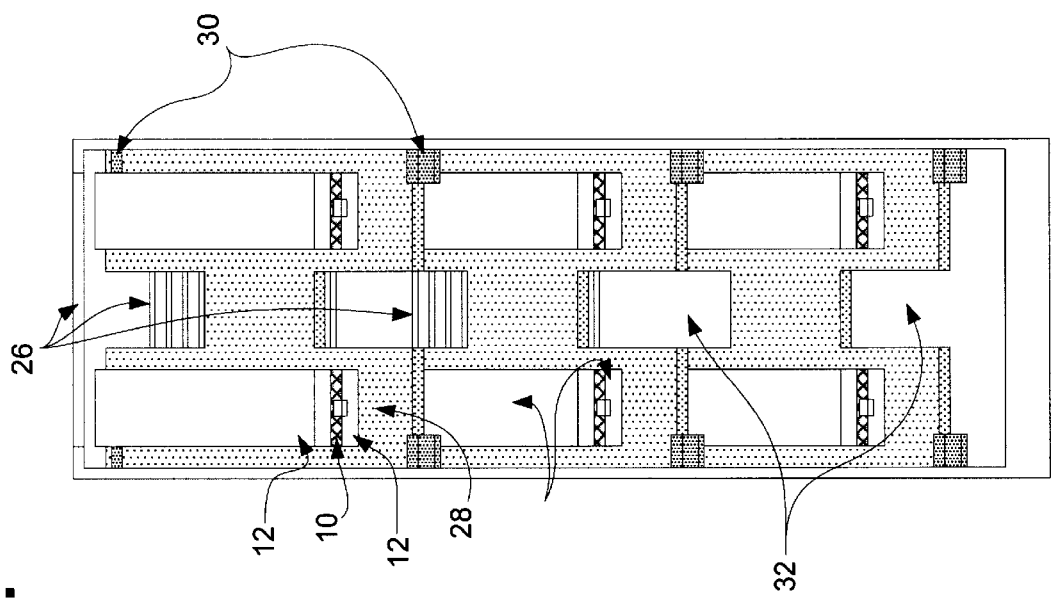
FIG. 5 is a front cut away view of an embodiment of the invention.

The embodiments of the present invention may be described herein in terms of a bank of Silicon Controlled Rectifiers (SCRs), which form a power bridge of an exciter for a power generation system. Although the embodiments are described herein in terms of SCRs, it should be understood that the present invention may be used with any heat-generating electrical device being used in any application.

In general terms, the embodiments to be described include a rack-mounting system for electrical devices that are contained in a housing. One end of each electrical device is tilted upwards at an angle to promote cooling air flow, reduce space requirements, improve serviceability, and provide other benefits.

The present invention may be used in conjunction with any heat-generating electrical device. For example, the heat-generating electrical device may comprise a diode, a Gate Turn Off Thyristor (GTO), a Press-pack IGBT, and the like. In one embodiment of the invention, the electrical devices are solid state devices. In another embodiment of the invention, the devices are high voltage devices. In yet another embodiment, the heat-generating electrical device is a Silicon Controlled Rectifier.

Some electrical devices, such as three-phase, full-wave, inverting thyristors, allow precise control of electrical currents, and are often used with an exciter unit to send a controlled DC current to an AC power generator. In order to operate at maximum efficiency, SCRs must be kept within an appropriate operating temperature range. If the SCR exceeds the maximum temperature, its performance may deteriorate, or it may fail completely. In one embodiment of the invention, the SCR, or other electrical device, may include thermal protection devices, such as fuses, snubbers, filters, and the like, to prevent failure of the SCR or other electrical device due to excessive temperatures. The electrical device may also comprise a thermostat, which may be linked to a monitoring system, a thermal protection device, or both.

Lower powered electrical devices typically produce less heat than higher powered electrical devices, and thus, lower powered devices may be adequately cooled by simple free convection of heat from the device's surface to the ambient air. Higher powered electrical devices, however, may require additional cooling devices or systems.

FIGS. 1 and 2 are end and side views, respectively, of an embodiment of an electrical device 10 that may be used with the invention, having heat sinks 12 attached to its upper and lower surfaces. The electrical device also has electrical attachment points 14, for connecting it to the rest of the electrical system. Heat sinks are known in the art. Heat sinks operate by conducting heat away from the SCR and releasing the heat by convection into the ambient air or other cooling gas or fluid. The heat sinks 12 may be made from any suitable material that provides high thermal conductivity, such as aluminum and the like. The heat sinks 12 may also be shaped to maximize their surface area, provide numerous heat-emitting edges, optimize convective currents created by the flow of heated air, and provide other beneficial features that improve heat transfer from the heat sink 12 to the air, thereby cooling the electrical device 10.

The invention further comprises a housing for containing the electrical devices 10. FIG. 3 depicts an isometric view of an embodiment of a housing 16 with the electrical devices 10 removed. In this embodiment, the housing 16 is a cabinet-like container that holds the electrical devices 10 in their proper place. The housing 16 may also serve to protect the electrical devices 10 from dust and other debris, and contact with other objects. The housing 16 may also protect other objects or people from accidental contact with the electrical devices 10, and may be electrically insulated.

In one embodiment of the invention, the housing 16 comprises a substantially horizontal bottom 18, a substantially horizontal top 20, and substantially vertical sides 22 extending between the bottom 18 and the top 20. The housing 16 may have a side panel 22 extending between each of the corresponding edges of the top 20 and bottom 16, to form a closed container, or it may have one or more open sides 22. In an embodiment intended for use as a stand-alone unit that will be able to stand on a floor without support from other objects, the housing 16 may have four sides 22 extending between a rectangular top 20 and a similarly shaped bottom 18.

In another embodiment of the invention, in which the housing is intended to be an ancillary unit, the housing 16 may be attached to another object, which may provide the housing 16 with support necessary to hold the housing 16 in position. The housing may be suspended off of the ground in such an embodiment. Such an embodiment may have an open top 20, bottom 18, or sides 22 which may face the supporting object or other objects. In yet another embodiment, the housing 16 is a large multipurpose housing assembly. For example, the housing 16 may be a large structure comprising many modular device bays, into which various electrical devices 10 and other devices may be installed.

The housing 16 may comprise a space-frame structure in which beam-type members are connected to one another at their ends and at intermediary points to form the majority of the load-bearing structure. The housing 16 may also comprise a monocoque structure, in which exterior or interior panels, or both, bear a substantial portion of the load. The housing 16 may comprise any suitable material, such as folded or stamped steel sheets, wooden panels, steel beams, and the like. The specific details of the design and fabrication of housings is within the ability of one skilled in the art.

In one embodiment of the invention the housing 16 further comprises an access panel 24, such as a removable panel, pivoting door, or the like. The electrical devices 10 may be removed, repaired, installed, or otherwise serviced through this access panel 24. The access panel 24 may also comprise a power cut-off switch that turns off the power to the electrical devices when the access panel is removed or opened, or a locking device to prevent unauthorized or unsafe access to the interior of the housing 16.

In one embodiment of the invention, the housing 16 further comprises ventilation openings 26 in one or more of the sides 22, top 20, and bottom 18. The ventilation openings 26 may allow ambient air to flow into and out of the housing to cool the electrical devices. Such ventilation openings 26 may be louvered, screened, filtered, or otherwise shielded to help prevent foreign matter from entering the housing 16. In one embodiment, a supply of forced air may be provided to the housing through one or more ventilation openings 26, which may be provided to cool electrical devices 10 that produce too much heat to be cooled by free convection of heat into the ambient air. The forced air may be supplied at all times, or it may be supplied intermittently, such by providing the forces air only when the electrical devices 10 reach a certain temperature or during periods of a fixed schedule.

Figure 4:
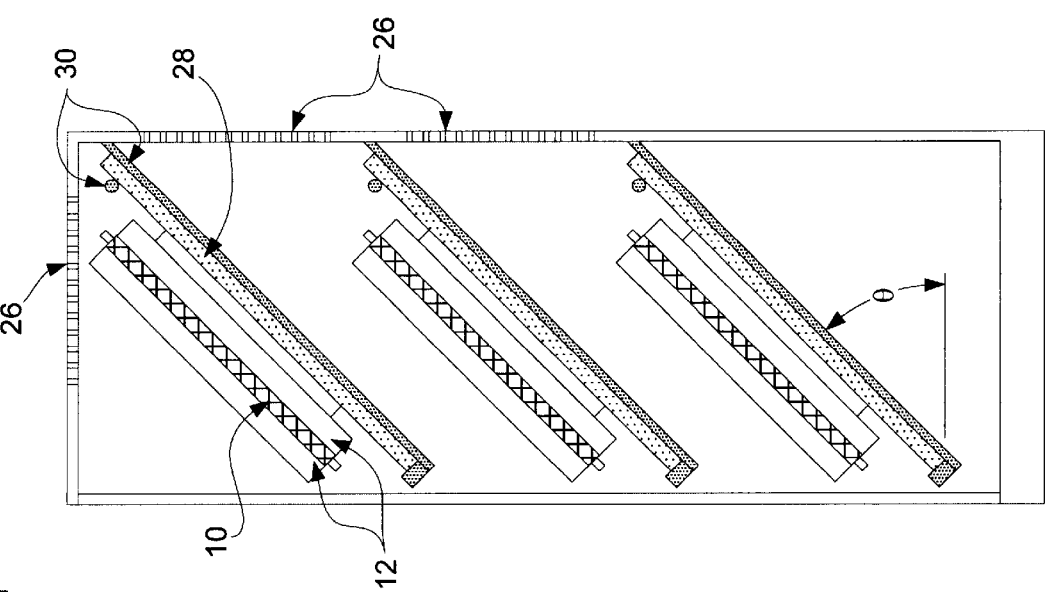
FIG. 4 is a side cut away view of an embodiment of the invention.

FIGS. 4 and 5, are side and front cut away views of an embodiment of the invention. The electrical devices 10 may be mounted directly to the housing 16, or they may be mounted to the housing 16 through intermediary components. In one embodiment of the invention, one or more electrical devices 10 may be mounted to platforms 28, which slide into racks 30 in the housing 16. In another embodiment of the invention, the platforms 28 may comprise air ports 32 to allow air to circulate freely throughout the interior of the housing 16, and may also provide access to the recesses of the housing 16 when the electrical devices 10 are installed.

The electrical devices 10 or intermediary components may be secured in the housing 16 by any suitable means known in the art. In one embodiment, the electrical devices (or the platforms 28 or other intermediary components to which they may be attached) are releasably fixed within the housing 16 such that the electrical devices 10 are securely held in place during operation, but can be removed using common tools or without tools and without substantial disassembly of the housing 16 or the apparatus as a whole.

In an embodiment comprising more than one electrical device 10, the electrical devices 10 may be mounted in a side-by-side fashion, and they may be stacked vertically, with one electrical device 10 above another. In the embodiment depicted in FIGS. 4 and 5, there are three pairs of electrical devices 10. Each pair of electrical devices 10 is mounted to a platform 28 in a side-by-side fashion, and the platforms 28 are mounted in a vertical stack within the housing 16. In a preferred embodiment, the electrical devices 10 are six SCRs forming a power bridge between an exciter and a power generator.

The electrical devices 10 are mounted in the housing 16 at an angle relative to the ground. In one embodiment, all of the electrical devices are tilted at the same angle $\Theta$, however, each electrical device may be tilted at a different angle. The angle $\Theta$ may be selected to provide several benefits.

Figure 7:
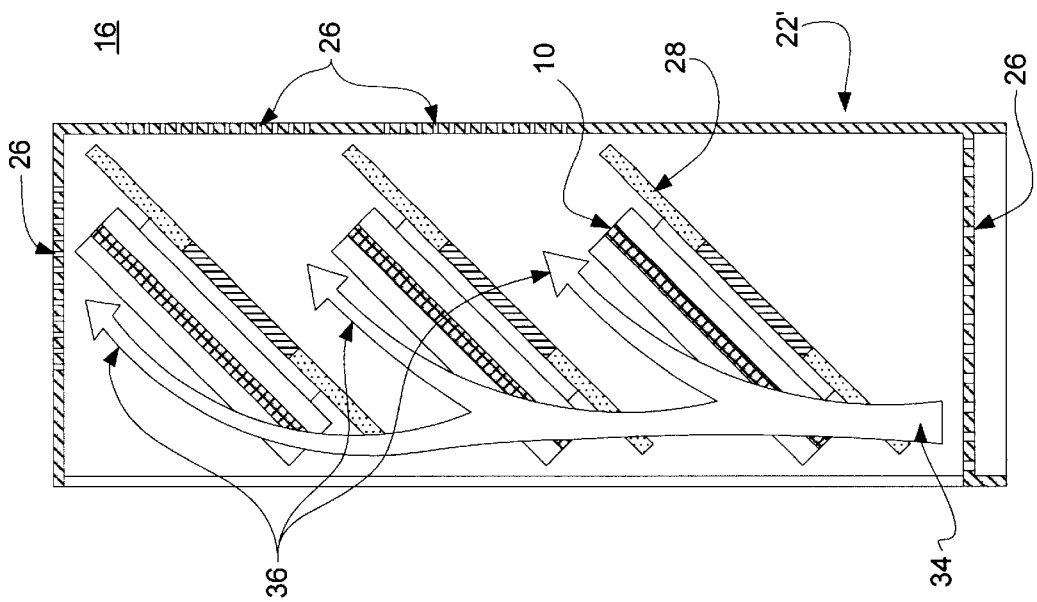
FIG. 7 is a cut away side view of the air flow depicted in FIG. 6, as viewed from reference line AA.
Figure 6:
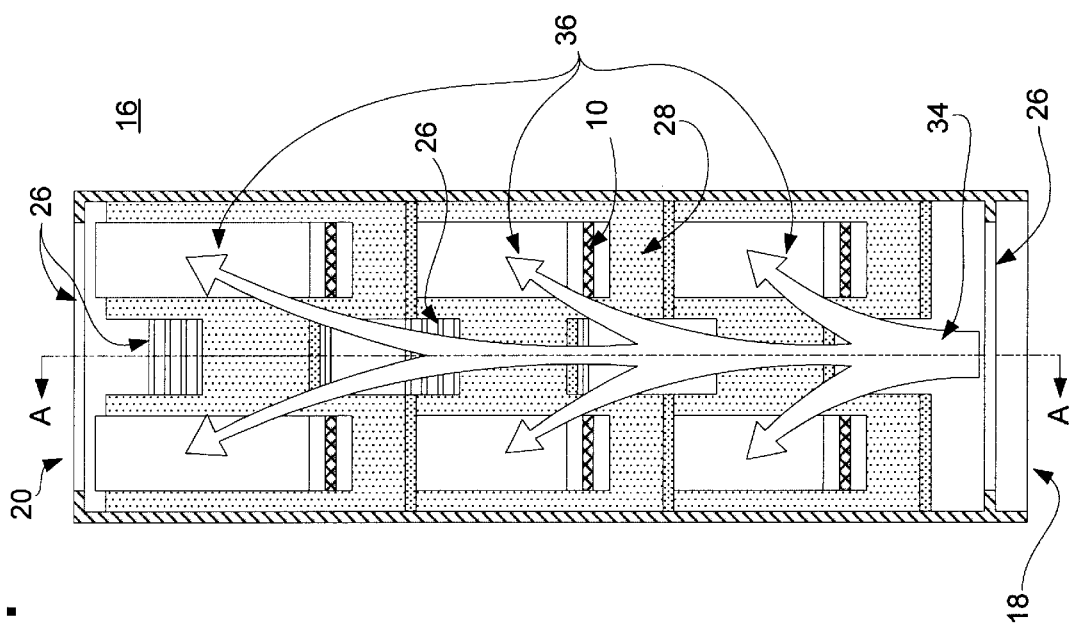
FIG. 6 is a cut away front view of the air flow in one embodiment of the present invention.

In one embodiment of the invention, the angle $\Theta$ is selected to provide improved heat handling characteristics. FIGS. 6 and 7 depict the air flow through one embodiment of the invention. In the embodiment of FIGS. 6 and 7, there are three side-by-side pairs of electrical devices 10, each equipped with heat sinks 12. Each pair of electrical devices 10 is attached to a platform 28, and each platform 28 is mounted on an angled rack (not shown) in the housing 16. Cool air 34 enters the housing 16 through ventilation openings 26 in the bottom 18 of the housing 16. The cool air passes upwards through the air ports 32 in the platforms, and backwards towards the ventilation openings 26 in the back side 22' and the top 20. As the air flows, it becomes heated by the electrical devices 10 and the heat sinks 12. The hot air 36 exits through the ventilation openings 26 in the back side 22' and top 20, thereby cooling the electrical devices 10 by convection. The rising hot air 36 may create an upward air current which may also serve to draw cool air 34 into the housing 16 to provide a convectively created airflow to cool the electrical devices 10.

In one embodiment of the invention, cool air impinges directly on the uppermost electrical devices 10 without being heated substantially by the lower electrical devices 10. Without being limited to any theory of operation, in such an embodiment, the hot air 36 by the electrical devices 10 may flow towards the back side 22' of the housing 16 as it rises due to a combination of thermal rising of the lighter hot air 36, boundary layer and aerodynamic characteristics of the air passing over the heat sinks 12, the location and angle $\Theta$ of the platforms 28, and other factors.

In another embodiment of the invention, electrical devices 10 that would normally require a supply of forced air to achieve adequate cooling may be adequately cooled by free convection of ambient air or by supplying a relatively lesser amount of forced air. In such an embodiment, the complexity and overall noise level of the electrical system may be reduced because no cooling fan, or a smaller cooling fan, may be required to help cool the electrical devices 10. Removing the cooling fans may also provide a significant reliability improvement.

In another embodiment of the invention, the angle $\Theta$ is selected to provide space savings benefits. By tilting the electrical devices 10 at an angle, the housing may be designed to occupy less floor space. Furthermore, the angled mounting system allows a greater variety of electrical devices 10 to be used in the same relatively small housing 16, as there is room to expand in both the vertical and horizontal directions. The angle $\Theta$ may also be selected to enable workers to more easily install, service, or remove the electrical devices. With the electrical devices tilted upwards, a worker can better view and manipulate the various parts of the electrical devices, especially those parts that are nearest the back side 22' of the housing 16. By making service easier and faster, the cost of service may be significantly reduced because the electrical devices may be out of operation for a shorter period of time during service. The angle may also be selected to help reduce the cost of producing the apparatus.

In one embodiment of the invention, the angle $\Theta$ is between approximately zero degrees and 90 degrees. In another embodiment of the invention, the angle $\Theta$ is between approximately 15 degrees and 75 degrees. In yet another embodiment of the invention, the angle $\Theta$ is between approximately 30 degrees and 60 degrees. In yet another embodiment of the invention, the angle $\Theta$ is between approximately 40 degrees and 50 degrees. In another embodiment of the invention, the angle $\Theta$ is approximately 45 degrees. The angle may vary to achieve a desired combination of heat dissipation, minimized manufacturing cost, accessibility, and capacity to house an optimal number and variety of heat-generating electrical devices.

The teachings herein may be employed to create an angled mounting rack for electrical devices, and the present invention also comprises a method for mounting electrical devices in a housing at an angle to provide cooling benefits, service benefits, space saving benefits or other benefits.

While the foregoing description includes many details and specificities, it is to be understood that these have been included for purposes of explanation only, and are not to be interpreted as limitations of the present invention. Many modifications to the embodiments described above can be made without departing from the spirit and scope of the invention, as is intended to be encompassed by the following claims and their legal equivalents.

What is claimed is:

1. An apparatus for mounting heat-generating electrical devices comprising:

a housing comprising a substantially horizontal bottom, a substantially horizontal top, substantially vertical sides extending vertically between the bottom and the top, and ventilation openings in at least one of the top, bottom or sides;

a supply of forced air passing through the housing;

two or more heat-generating electrical devices;

two or more platforms, each of the two or more platforms having mounted on an upper surface thereof one or more of the two or more electrical devices;

each of the two or more electrical devices and the respective platform being releasably fixed within the housing and being oriented at an angle of between about 15 degrees and about 75 degrees relative to the bottom of the housing; and at least one of the two or more electrical devices being mounted vertically above at least another of the two or more electrical devices; and wherein each of the two or more electrical devices receives a portion of the supply of forced air that has not been substantially heated by another of the two or more electrical devices, and the portion of the supply of forced air is free to exhaust substantially unimpeded from the housing.

2. The apparatus of claim 1, wherein the housing further comprises an access door through which the two or more electrical devices may be serviced.

3. The apparatus of claim 1, further comprising a thermostat for measuring temperature in the housing.

4. The apparatus of claim 1, further comprising a thermal protection device associated with the two or more electrical devices.

5. The apparatus of claim 1, wherein the two or more electrical devices are solid-state devices.

6. The apparatus of claim 1, wherein the two or more electrical devices are silicon controlled rectifiers.

7. The apparatus of claim 1, wherein the two or more electrical devices are high voltage devices.

8. The apparatus of claim 1, wherein the two or more electrical devices comprise six electrical devices.

9. The apparatus of claim 1, further comprising one or more heat sinks attached to each of the two or more electrical devices.

10. The apparatus of claim 1, further comprising one or more air ports in each of the two or more platforms.

11. The apparatus of claim 1, wherein two of the two or more electrical devices are mounted in a side-by-side configuration on each of the two or more platforms.

12. The apparatus of claim 1, wherein the two or more electrical devices may be serviced while in the housing.

13. The apparatus of claim 1, wherein the angle is between about 30 degrees and about 60 degrees.

14. The apparatus of claim 1, wherein the angle is between about 40 degrees and about 50 degrees.

15. The apparatus of claim 1, wherein the angle is about 45 degrees.

16. The apparatus of claim 1, wherein the angle is selected to promote cooling of the two or more electrical devices.

17. The apparatus of claim 1, wherein the angle is selected to reduce space requirements.

18. The apparatus of claim 1, wherein the angle is selected to provide service benefits.

19. The apparatus of claim 1, wherein at least two of the two or more electrical devices are oriented at different angles relative to the bottom of the housing.

20. An apparatus for mounting high voltage silicon controlled rectifiers comprising:

a housing comprising a substantially horizontal bottom, a substantially horizontal top, and substantially vertical sides extending vertically between the bottom and the top;

ventilation openings in at least one of the bottom, sides, and top;

a supply of forced air passing through the housing;

three platforms;

three pairs of silicon controlled rectifiers, each pair mounted on top of one of the platforms in a side-by-side fashion, the platforms being releasably mounted in a vertical stack within the housing and oriented at an angle of between about 15 degrees and about 75 degrees relative to the bottom of the housing;

wherein each of the silicon controlled rectifiers receives a portion of the supply of forced air that has not been substantially heated by another of the silicon controlled rectifiers, and the portion of the supply of forced air is free to exhaust substantially unimpeded from the housing.

21. The apparatus of claim 20, wherein the housing further comprises an access door through which the silicon controlled rectifiers may be serviced.

22. The apparatus of claim 20, further comprising one or more heat sinks attached to each of the silicon controlled rectifiers.

23. The apparatus of claim 20, further comprising one or more air ports in each of the platforms.

24. The apparatus of claim 20, wherein the angle is between about 30 degrees and about 60 degrees.

25. The apparatus of claim 20, wherein the angle is between about 40 degrees and about 50 degrees.

26. The apparatus of claim 20, wherein the angle is about 45 degrees.

27. The apparatus of claim 22, wherein the angle is selected to promote cooling of the silicon controlled rectifiers.

28. The apparatus of claim 20, wherein the angle is selected to reduce space requirements.

29. The apparatus of claim 20, wherein the angle is selected to provide service benefits.

30. A method for cooling electrical devices mounted in a housing comprising:

providing a housing comprising a substantially horizontal bottom, a substantially horizontal top, substantially vertical sides extending vertically between the bottom and the top, and ventilation openings in at least one of the top, bottom or sides;

providing a supply of forced air passing through the housing;

providing two or more heat-generating electrical devices;

providing two or more platforms, each of the two or more platforms having mounted on an upper surface thereof one or more of the two or more electrical devices;

releasably mounting each of the two or more electrical devices and the respective platforms within the housing at an angle of between about 15 degrees and about 75 degrees relative to the bottom of the housing, with at least one of the two or more electrical devices being mounted vertically above at least another of the two or more electrical devices;

providing a portion of the supply of forced air to each of the two or more electrical devices that has not been substantially heated by another of the two or more electrical devices, the portion of the supply of forced air being free to exhaust substantially unimpeded from the housing.

31. The method of claim 30, further comprising providing an access door through which the two or more electrical devices may be serviced.

32. The method of claim 30, further comprising attaching one or more heat sinks to each of the two or more electrical devices.

33. The method of claim 30, further comprising providing one or more air ports in each of the two or more platforms.

34. The method of claim 30, further comprising mounting two or more electrical devices in a side-by-side configuration on each of the two or more platforms.

35. The method of claim 30, wherein the step of releasably mounting each of the two or more electrical devices and the respective platforms within the housing at an angle comprises mounting each of the two or more heat-generating electrical devices and the respective platforms within the housing at an angle of between about 30 degrees and about 60 degrees relative to the bottom of the housing.

36. The method of claim 30, wherein the step of releasably mounting each of the two or more electrical devices and the respective platforms within the housing at an angle comprises mounting each of the two or more heat-generating electrical devices and the respective platforms within the housing at an angle of between about 40 degrees and about 50 degrees relative to the bottom of the housing.

37. The method of claim 30, wherein the step of releasably mounting each of the two or more electrical devices and the respective platforms within the housing at an angle comprises mounting each of the two or more heat-generating electrical devices and the respective platforms within the housing at an angle of about 45 degrees.

38. The method of claim 30, wherein the step of releasably mounting each of the two or more electrical devices and the respective platforms within the housing at an angle comprises selecting an angle to promote cooling of the two or more electrical devices.

39. The method of claim 30, wherein the step of releasably mounting each of the two or more electrical devices and the respective platforms within the housing at an angle comprises selecting an angle to reduce space requirements.

40. The method of claim 30, wherein the step of releasably mounting each of the two or more electrical devices and the respective platforms within the housing at an angle comprises selecting an angle to provide service benefits.

41. The method of claim 30, wherein the step of releasably mounting each of the two or more electrical devices and the respective platforms within the housing at an angle comprises mounting at least two of the two or more electrical devices at different angles relative to the bottom of the housing.

42. The apparatus of claim 1, wherein the two or more electrical devices are arranged in a two-dimensional array.

43. The apparatus of claim 20, wherein the three pairs of silicon controlled rectifiers are arranged in a two-dimensional array.

44. The method of claim 30, further comprising the step of arranging the two or more electrical devices in a two-dimensional array.

* * * * *